United States Patent [19]

Nakahashi et al.

[11] Patent Number: 4,917,642

[45] Date of Patent: Apr. 17, 1990

[54] AIR-TIGHT CERAMIC CONTAINER

[75] Inventors: Masako Nakahashi; Makoto Shirokane; Hiromitsu Takeda; Tatsuo Yamazaki, all of Tokyo; Tsutomu Okutomi, Yokohama; Shozi Niwa, Sagamihara; Mikio Okawa, Tokyo; Mitsutaka Homma, Tokyo, all of Japan

[73] Assignee: Kabushiki Kaisha Toshiba, Kawasaki, Japan

[21] Appl. No.: 176,752

[22] Filed: Apr. 1, 1988

[30] Foreign Application Priority Data

| Apr. 2, 1987 | [JP] | Japan | 62-79618 |
| Jul. 13, 1987 | [JP] | Japan | 62-172843 |
| Jul. 13, 1987 | [JP] | Japan | 62-172845 |
| Mar. 4, 1988 | [JP] | Japan | 63-49758 |

[51] Int. Cl.$^4$ .............................................. H01J 9/26
[52] U.S. Cl. ....................................... 445/44; 228/122; 228/263.11
[58] Field of Search ................. 445/44; 228/120, 122, 228/903, 263.11

[56] References Cited

U.S. PATENT DOCUMENTS

| 2,362,893 | 11/1944 | Durst | 228/263.11 |
| 2,570,248 | 10/1951 | Kelly | . |
| 2,731,578 | 1/1956 | McCullough | 445/44 |
| 2,798,577 | 7/1957 | LaForge | 228/122 |
| 2,996,401 | 8/1961 | Welch | 228/122 |
| 3,063,144 | 11/1962 | Palmour, III | . |
| 3,088,201 | 5/1963 | Louden | 445/44 |
| 3,141,058 | 7/1964 | Titus | . |
| 3,171,734 | 3/1965 | Berson | 228/263.11 |
| 3,368,023 | 2/1968 | Dimock | 228/122 |
| 3,475,442 | 10/1969 | Roeder | 228/263.11 |
| 3,656,225 | 4/1972 | Bereza | 228/122 |
| 4,077,114 | 3/1978 | Sakuma | 228/122 |
| 4,436,241 | 3/1984 | Lupperts | 445/44 |
| 4,729,504 | 3/1988 | Edamura | 228/122 |

FOREIGN PATENT DOCUMENTS 1045305 11/1958 Fed. Rep. of Germany .
2450794 10/1980 France .

OTHER PUBLICATIONS

*Electronics*, 20, Jul. 1947, p. 97, "Metal–Ceramic Brazed Seals", by R. J. Bondley.
*Welding Journal*, Oct. 1985, pp. 27–32, "Ceramic–To–Metal Joining with Active Brazing Filler Metal", by H. Mizuhara and K. Mally.

*Primary Examiner*—Kurt Rowan
*Attorney, Agent, or Firm*—Oblon, Fisher, Spivak, McClelland, Maier & Neustadt

[57] ABSTRACT

A method of manufacturing an air-tight ceramic container is disclosed. This method includes the steps of coating an active metal consisting of Ti and/or Zr on an opening end face of a ceramic tubular member in an amount of 0.1 to 10 mg/cm$^2$, thereby forming an active metal layer, placing a brazing filler metal on the active metal layer, placing a metal cover member for shielding an opening portion of the ceramic tubular member so that a peripheral portion end face of the metal cover member is in contact with the brazing filler metal, and melting the brazing filler metal by heating, thereby brazing the metal cover member to the opening end face of the ceramic tubular member.

13 Claims, 9 Drawing Sheets

AIR-TIGHT CERAMIC CONTAINER

BACKGROUND OF THE INVENTION

1. Field of the Invention

The present invention relates to a method of manufacturing an air-tight ceramic container and a method of manufacturing a vacuum interrupter using the air-tight ceramic container.

2. Description of the Prior Art

A ceramic is an insulative material having a good heat-resistance and hence is used as a material for various electrical parts. On example is an air-tight container used in an electrical part such as a vacuum interrupter. Such an air-tight container is used in such a manner that its interior is maintained in a vacuum state or filled with an inert gas. Therefore, in order to maintain such an internal atmosphere, an air-tight property must be strictly maintained.

Figure 1A:
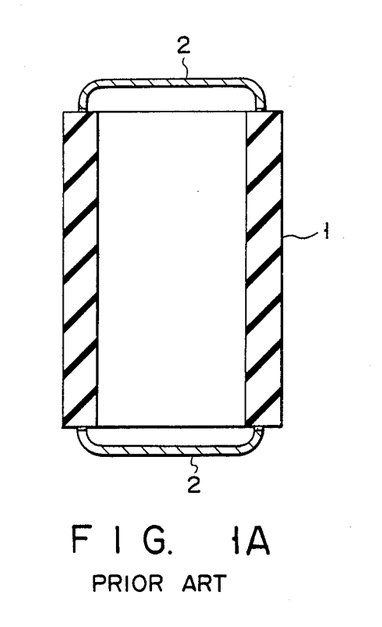
FIGS. 1A to 1D are sectional views for explaining a conventional method of manufacturing an air-tight ceramic container.

As shown in FIG. 1A, a conventional airtight ceramic container has a structure in which opening end faces of ceramic tubular member 1 are shielded by metal cover members 2. In manufacturing such an air-tight ceramic container, the opening end faces of ceramic tubular member 1 is metallized, then metal cover members 2 is bonded thereon by brazing. In this conventional method, since a coefficient of thermal expansion of ceramic tubular member 1 differs from that of each metal cover member 2, a thermal stress is generated at a bonding portion when the portion is cooled after being heated upon brazing. When the thermal stress is large, cracks are generated in ceramic tubular member 1, and no sufficient air-tight property can be obtained. Therefore, the following techniques have been proposed to reduce the thermal stress and prevent generation of cracks.

According to a first technique, a metal having a small coefficient of thermal expansion such as Mo or W or an alloy having a small coefficient of thermal expansion such as invar or Kovar is used for the metal cover member.

Figure 1B:
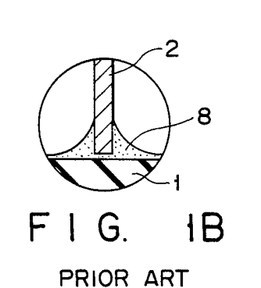

According to a second technique, an end portion of each metal cover member 2 is bent as shown in FIG. 1A, and its end face is bonded to the end face of ceramic tubular member 1 (endface-bonding), thereby reducing a bonding area. Since the magnitude of thermal stress generated at the bonding portion is proportional to a bonding area between the two members, this endface-bonding contributes to reduce the thermal stress. In order to obtain a sufficient bonding strength and air-tight property at the bonding portion in the endface-bonding, brazing filler metal layer 8 must be spread like an unfolded fan from the end portion of metal cover member 2 toward the end face of ceramic tubular member 1, as shown in FIG. 1B.

Metallization used in manufacturing the above air-tight ceramic container will be described below. Conventional metallizing methods are as follows (1) A powder mainly consisting of Mo or W is applied on a surface of a ceramic member and heated up to 1,400°0 to 1,700° C. in a reducing atmosphere to react it with the ceramic material, thereby performing metallization. Ni or the like is plated on a metallized layer as needed. In this method, a treatment must be performed at a very high temperature for metallizing, resulting in complex manufacturing steps.

(2) Au or Pt is placed on a surface of ceramic member and heated while a pressure is applied thereto, thereby performing metallization. In this method, since an expensive noble metal is used, manufacturing cost is increased. In addition, since a high pressure is required to increase a contact property, it is not preferable to apply this method to electronic parts not allowing deformation.

(3) An active metal such as Ti or Zr and a transition metal such as Ni or Cu are placed on a ceramic base material and heated at a temperature higher than the melting point of the alloy of these metals, thereby performing metallization (Japanese Patent Disclosure (Kokai) No. 56-163093). This method utilizes the fact that when an active metal such as Ti or Zr is used to form an alloy with a transition metal such as Cu or Ni, these alloys have a melting point lower by several hundreds °C. than that of either of the metals in their eutectic compositions. In this method, since the active metal wets the ceramic material, metallization can be performed substantially without pressurization. In addition, it is possible to metallize the surface of ceramic member with a strong bond by an effect of the active metal.

In order to manufacture an air-tight ceramic container using any of above metallizing methods (1) to (3), the end faces of a ceramic tubular member are metallized and then metal cover members are brazed to the tubular member. That is, since metallizing of ceramic tubular member, and brazing of the metal cover members must be independently performed, manufacturing steps are undesirably complicated. Therefore, a method has been proposed in which metal cover members are brazed to the end faces of a ceramic tubular member without independent metallizing step, thereby manufacturing an air-tight ceramic container.

The following one-step bonding method (Japanese Patent Disclosure (Kokai) No. 59-32628) has been proposed as a method of bonding a ceramic member with a metal member without independent metallizing step. In this method, a brazing filler metal having a low melting point (especially an Ag-brazing filler metal) which contains Ti and/or Zr as the active metal is used. Alternatively, a foil of the above active metal and the Ag-brazing filler metal are stacked, and the stacked body is inserted and heated between the ceramic and metal members. Since this one-step bonding method does not require independent metallizing step, manufacturing steps can be simplified.

Figure 1C:
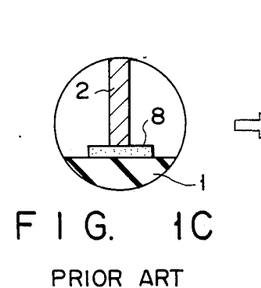
Figure 1D:
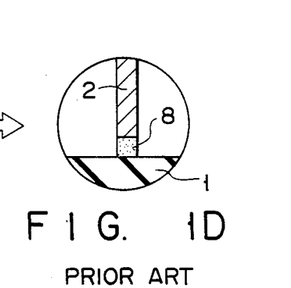

However, in the above one-step bonding method, a preferred bonding structure shown in FIG. 1B cannot be obtained. When a bonding area between the ceramic and metal members is sufficiently large, a substantially sufficient bonding property can be obtained by the one-step bonding method. However, if the bonding area is small, a sufficient bonding property with a preferred bonding structure of FIG. 1B is not attained. Therefore, this method is not suitable to manufacture the air-tight ceramic container described above. That is, even when brazing metal foil 3 larger than the end face of metal cover member 2 is used for brazing as shown in FIG. 1C, a filler metal layer is formed only immediately below the end face of metal cover member 2, as shown in FIG. 1D, because wettability of the ceramic surface with the melted filler metal is not sufficient. As a result, a clearance is easily produced in a bonding portion, and metal cover member 2 is removed even with a small external force.

A conventional vacuum interrupter using the above air-tight ceramic container will be described below.

Figure 2:
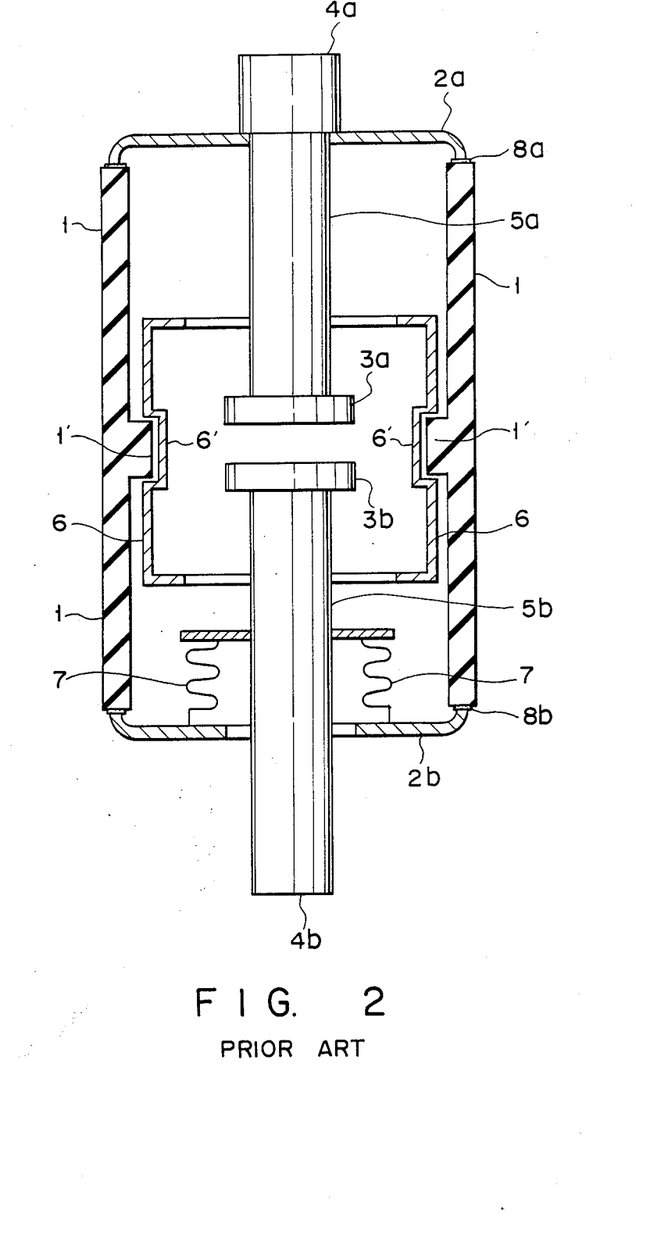
FIGS. 2 and 3 are sectional views of conventional vacuum valves, respectively.

FIG. 2 shows a structure of the conventional vacuum interrupter. In FIG. 2, reference numeral 1 denotes a ceramic tubular member. Metal cover members 2a and 2b are air-tightly bonded to both opening end faces of ceramic tubular member 1 by brazing with Ag-filler metal layer 8a and 8b, thereby constituting a vacuum container whose interior is maintained in a vacuum. In this vacuum container, fixed and movable conductor rods 5a and 5b are provided to oppose each other and extend through metal cover members 2a and 2b, respectively. As shown in FIG. 2, fixed conductor rod 5a is fixed to metal cover member 2a, and movable conductor rod 5b is movable along its axial direction. A pair of contact members 3a and 3b are placed at opposing end portions of conductor rods 5a and 5b, respectively. Contact member 3a is a fixed contact member, and contact member 3b is a movable contact member. Contact member 3b is brazed to movable conductor rod 5b either directly or through an electrode (not shown). The other end of fixed conductor rod 5a constitutes fixed terminal 4a, and the other end of movable conductor rod 5b constitutes movable terminal 4b. Therefore, when movable conductor rod 5b moves in the axial direction, contact members 3a and 3b are opened/closed. Bellows 7 is mounted on movable conductor rod 5b so that movable member 5b can move in the axial direction while a vacuum air-tight state in the container is maintained by bellows 7. A metal arc-shield (not shown) is provided on bellows 7 to prevent bellows 7 from being covered with arc vapor. In addition, metal arc-shield 6 is provided to cover contact members 3a and 3b, thereby preventing ceramic tubular member 1 from being covered with the arc vapor. Therefore, an evaporated contact member material is prevented from being adhered on an inner surface of ceramic tubular member 1 to cause short-circuiting.

In the above vacuum interrupter, the arc-shield 6 must be fixed at a predetermined position in the vacuum container. For this purpose, projection 1' is formed in ceramic tubular member 1 as shown in FIG. 2. Projection 1' is formed to engage with recess 6' provided to arc-shield 6, thereby preventing removal or movement of arc-shield 6. Alternately, a recess may be formed in ceramic tubular member 1 and engaged with a projection formed on arc-shield 6. This fixing method does not require metallization when arc-shield 6 is mounted on ceramic tubular member 1 and therefore is economically advantageous. However, since a gap is inevitably produced between ceramic tubular member 1 and arc-shield 6, arc-shield 6 is vibrated or moved when the vacuum valve is vibrated. Furthermore, when a trouble occurs in recess 6', arc-shield 6 may be removed from a predetermined mounting portion, thereby degrading withstand voltage and blocking characteristics.

As a second method of fixing arc-shield 6 to ceramic tubular member 1, an inner surface of ceramic tubular member 1 is metallized and then arc-shield 6 is brazed to the inner surface. In this method, any of above methods (1) to (3) can be used as the metallizing method. According to this method, arc-shield 6 can be prevented from being removed or moved. However, with any of methods (1) to (3), problems caused by metallization occur as described above. That is, in method (1), complex steps such as a high-temperature treatment are required. In method (2), not only an economical problem is posed but also productivity is degraded because a tool for obtaining a sufficient pressure occupies a predetermined space in a brazing furnace. In method (3), it is difficult to obtain a desired bonding strength.

Figure 3:
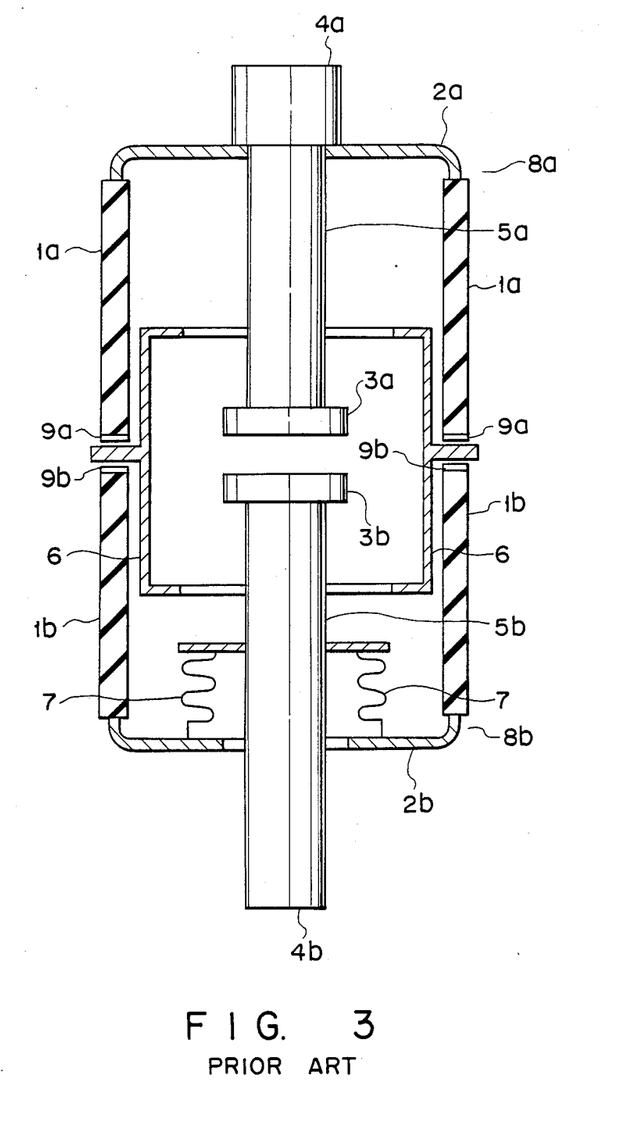

FIG. 3 shows a third method of mounting arc-shield 6 on ceramic tubular member 1. That is, ceramic tubular member 1 in FIG. 2 is divided into two ceramic members 1a and 1b, and metallization is performed to opposing end faces 9a and 9b. Then, a flange formed on arc-shield 6 is inserted and air-tightly shielded between end faces 9a and 9b. Also in this case, any of above methods (1) to (3) is used as the metallizing method. Therefore, since metallization is used, the same drawbacks as in the above two methods are present. Furthermore, this method is economically disadvantageous because the number of metallizing portions is increased. In addition, since the number of portions to be air-tightly shielded is increased, this method is disadvantageous in terms of reliability for maintaining the air-tight property.

SUMMARY OF THE INVENTION

The present invention has been made in consideration of the above situation and has as its object to manufacture an air-tight ceramic container having a sufficient bonding strength and a high air-tight property by end-face-bonding a peripheral portion of a metal cover member to an opening end face of a ceramic tubular member without independent metallizing step the opening end face of the ceramic tubular member.

It is a second object of the present invention to provide a method of manufacturing a vacuum interrupter utilizing the above air-tight ceramic container, in which, part of an inner surface of a ceramic tubular member can be simply and directly bonded to an arc-shield with a sufficient strength without independent step of metallizing the inner surface of the ceramic tubular member.

According to the present invention, there is provided a method of manufacturing an air-tight ceramic container, comprising the steps of: coating an active metal consisting of Ti and/or Zr on an opening end face of a ceramic tubular member in an amount of 0.1 to 10 mg/cm$^2$, thereby forming an active metal layer; placing a brazing filler metal on the active metal layer; placing a metal cover member for shielding an opening portion of the ceramic tubular member so that a peripheral end face of the metal cover member is in contact with the brazing filler metal; and melting the filler metal by heating, thereby brazing the metal cover member to the opening end face of the ceramic tubular member.

According to the present invention, there is provided a method of manufacturing a vacuum interrupter which comprises an air-tight ceramic container obtained by the above method; a pair of conductor rods extending through the ceramic container from outside to inside to oppose each other, at least one of the conductor rods being moved in an axial direction so that the conductor rods can be opened/closed; metal contact members arranged at the distal ends of the conductor rods; a bellows for moving the conductor rods in the axial direction while maintaining a vacuum state in the container; and a metal arc-shield, disposed to surround the contact members, for preventing adhesion of the metal evaporated from the contact members to an inner surface of the ceramic tubular member. The manufacturing method comprises the steps of: coating a powder of an active metal consisting of Ti and/or Zr to an inner surface of the ceramic tubular member in an amount of 0.1 to 10 mg/cm$^2$, thereby forming an active metal layer; placing a brazing filler metal on the active metal layer; placing the arc-shield to be in contact with the solder metal; and melting the solder metal by heating, thereby bonding the arc-shield to the inner surface of the ceramic tubular member.

DETAILED DESCRIPTION OF THE PREFERRED EMBODIMENTS

The present invention will be described in detail below.

A bonding method which is an essential part of the present invention will be described.

In the present invention, in order to bond a ceramic tubular member with a metal cover member, an active metal such as Ti or Zi is coated on a bonding surface of the ceramic tubular member. This is not a metallization process, but rather a coating process which differs from a conventional technique. That is, a performed layer is not a metallized layer but an active metal layer. Since the metal cover member is brazed on this active metal layer, the active metal is caused to react with the ceramic upon heating. Therefore, brazing and metallization are simultaneously performed. This bonding method can be considered to be a one-step bonding method, whereas no independent metallizing step is performed in advance.

It is important in the above one-step bonding method to coat the active metal on the ceramic surface while it is in tight contact therewith and to limit its coating amount to 0.1 to 10 mg/cm$^2$. Therefore, this method differs from the conventional method in which the active metal plate is merely placed on the surface of the ceramic member. As a result of the bonding method of the present invention, a desired bonding structure as shown in FIG. 1B can be obtained. This is due to the fact that the ceramic member surface is preferably metallized by coating the active metal thereon and setting the coating amount of the active metal within the above range. For example, a powder of the above active metal was applied on a surface of an alumina ceramic disk, an Ag-brazing filler metal (72% Ag-Cu) was placed on the disk and heated in a vacuum, and the spreading of the melted filler metal was checked. As a result, it was confirmed that when the coating amount of the active metal powder was 0.1 to 10 mg/cm$^2$, the filler metal was sufficiently spreaded, and a successful metallization was performed. Since such a successful metallization can be performed, even when a bonding area is small as in end face-bonding, a good bonding structure having a sufficient bonding strength can be obtained without any clearance. To the contrary, when the coating amount of the active metal powder is too small or too large, satisfactory metallization cannot be performed in subsequent brazing, and the spreading of the brazing filler metal is poor. Therefore, a bonding having predetermined characteristics cannot be obtained.

According to the present invention, by applying the above bonding method, an air-tight ceramic container having a highly reliable air-tight property can be obtained without increasing a bonding area between the ceramic tubular member and the metal cover member. In addition, by applying the above bonding method to bond the arc-shield with the inner surface of the ceramic tubular member, the arc-shield can be easily fixed thereon and is not removable thereafter.

Examples of methods of coating the active metal powder on the bonding surface of the ceramic tubular member in the above bonding method are as follows.

In the first method, an organic adhesive, obtained by kneading a binder and a solvent, is applied on the bonding surface of the ceramic tubular member, and a powder of the active metal is sprayed on the adhesive layer. Although the binder and the solvent used in this method are not limited, it is preferable that they are completely decomposed and removed in a subsequent heat treatment. Examples of the binder are polyvinyl alcohol and ethyl cellulose, and examples of the solvent are ethanol and tetralin.

In the second method, the active metal powder, an organic binder, and a solvent are kneaded to prepare a mixture, and the mixture is applied on the bonding surface of the ceramic tubular member through a screen consisting of a metal mesh or the like. The binder and the solvent are selected from those elements listed above.

In the third method, the active metal is coated on the bonding surface of the ceramic tubular member by deposition, sputtering, or the like.

In the above applying or spraying method, a particle size is preferably not more than 40 μm in order to control the coating amount of the active metal. More preferable particle size is 0.1 to 10 μm, while the fluidity of the paste is degraded if it is too large. In addition, when a mixture of Ti and Zr is used as the active metal, a mixing ratio is not at all limited and can be arbitrarily set.

Examples of the brazing filler metal used in the above bonding method are preferably Ag-brazing filler metals such as: Ag-Cu, Ag-Cu-Sn, and Ag-Cu-Zn. In order to perform brazing, a brazing filler metal is placed on the bonding surface of the ceramic tubular member on which the above active metal powder is coated, and a metal member (metal cover member or arc-shield) to be bonded is brought into contact with the brazing filler metal and then heated to a temperature which causes the brazing filler metal to melt. In this brazing step, a non-oxidizing atmosphere such as a vacuum or argon gas atmosphere is suitable as a heat treatment atmosphere.

A method of manufacturing an air-tight ceramic container according to the present invention will be described below. In this case, a material of ceramic tubular member 1 is not limited. For example, an oxide ceramic such as $Al_2O_3$ or a nitride ceramic such as AlN or $Si_3N_4$ can be suitably used. As for the composition of metal cover member 2, a material which has a coefficient of thermal expansion close to that of the ceramic tubular member is preferably used. It is preferable that such a material be used because the thermal stress upon bonding can be reduced as described above. Examples of a preferable material are Mo, W, invar, and Kovar. When ceramic tubular member 1 and metal cover member 2 are bonded to one another, endface-bonding as shown in FIGS. 1B is used in order to reduce the bonding area, thereby reducing the thermal stress. As described above, in the present invention, a sufficient bonding strength and air-tight property can be obtained by endface-bonding.

Figure 4A:
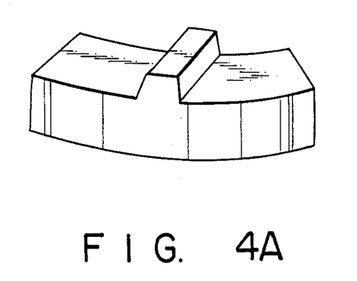
FIGS. 4A and 4B and FIGS. 5A to 5C are perspective views and sectional views, respectively, of brazing metal foil conveniently used in the present invention.
Figure 4B:
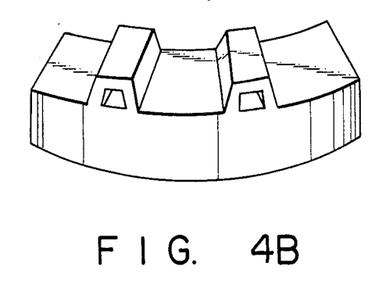

In the method of manufacturing an air-tight ceramic container according to the present invention, a brazing metal foil as shown in FIGS. 4A or 4B is preferably used to braze ceramic tubular member 1 with metal cover member 2. As shown in FIGS. 4A and 4B, these brazing metal foils have rough upper surfaces with projections protruding therefrom and smooth lower surfaces. The brazing metal foil shown in FIG. 4B has a hole formed through each projection. When each of these brazing metal foils is used for brazing, its smooth lower surface is brought into contact with the bonding surface of ceramic tubular member 1, and the upper surface with the protruding projections is brought into contact with the end face of metal cover member 2. When brazing is performed in this state, the following effects can be obtained.

When brazing is performed, a decomposition gas, an adsorption gas, and the like are released from ceramic tubular member 1 into the container upon heating. Therefore, in order to achieve a predetermined atmosphere such as a vacuum state in the container, these gases must be exhausted to the outside before the brazing process has been completed. When the above brazing filler metal foil is used, a gap is formed between the foil and the metal cover member due to the presence of the protruding projections. This gap, formed by the projections, serves as a gas exhaust path located on the upper surface of the brazing metal foil. This effect is further improved by providing the through holes as shown in FIG. 4B. However, this exhaust path must be completely closed when brazing is finished so as to obtain a sufficient air-tight property. In consideration of this and the stability obtained when the brazing metal foil is placed on the bonding portion, a preferable depth or height of the projections is 20 $\mu$m to 5 mm.

Since the lower surface of each brazing metal foil is smooth, a satisfactory bonding can be obtained on the ceramic end face having poor wettability with respect to a melted brazing filler metal. If a clearance is present between the thin solder plate and the ceramic tubular member surface, the melted brazing filler metal cannot sufficiently spread on the bonding surface having a poor wettability. Therefore, a good bonding cannot be obtained, resulting in a poor air-tight property. As described above, the projections are formed on the upper surface of each of the brazing filler metal foils in FIGS. 4A and 4B to serve as the gas exhaust path, while at the same time producing a good bonding with its smooth lower surface which is brought into contact with the ceramic.

Figure 5A:
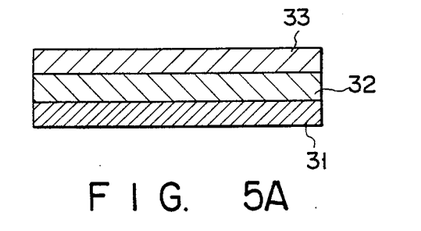

FIG. 5A shows another preferred example of a brazing metal foil. As shown in FIG. 5A, this foil has a multi-layer structure in which two brazing filler metal layers 31 and 33 sandwich a barrier layer consisting of a metal having a higher melting point than that of the two brazing filler metal layers. These two brazing filler metal layers may be the same or different. An object of using such a brazing metal foil and an effect obtained thereby are as follows.

Unlike in a diffusion bonding or a melt welding process, in a technique of bonding different materials by brazing, an alloy layer is not formed by causing the materials to be bonded to react with one another. Therefore, the bonding strength can not be degrade by a weak alloy layer. However, constituent elements of these members are sometimes caused to diffuse rapidly in a melted brazing filler metal and react with one another, thereby forming a weak alloy layer. Therefore, in the brazing metal foil of FIG. 5A, barrier layer 32 is provided to prevent the melted and diffused elements in the melted brazing filler metal from being brought into contact with one another, thereby preventing the formation of a weak alloy layer. That is, when brazing filler metal layers 31 and 33 are melted, barrier layer 32 remains unmelted because of its high melting point.

Note that although the thickness of barrier layer 32 is not limited, it is preferable that it falls within the range of about 0.01 to 5 mm so as to reliably function as a barrier and to allow easy handling.

Figure 5B:
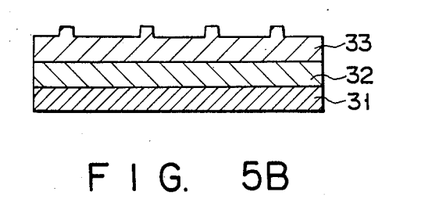
Figure 5C:
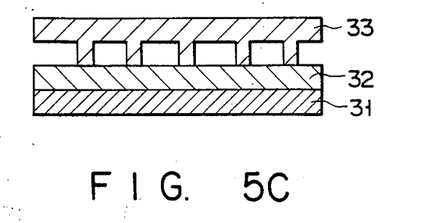

A brazing metal foil which have both features of FIG. 5A and that of FIGS. 4A and 4B can also be employed. FIGS. 5B and 5C show examples of such a brazing metal foil. In these foils, gas exhaustion as described above with reference to FIGS. 4A and 4B can be simultaneously performed.

Figure 6:
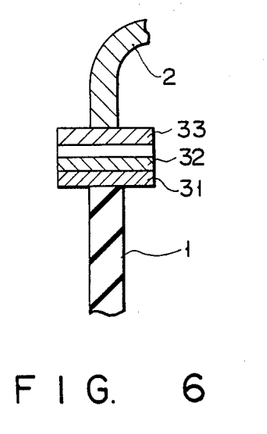
FIG. 6 is a sectional view for explaining a method of using the thin brazing metal foil shown in FIG. 5C.

FIG. 6 shows a method of manufacturing the air-tight ceramic container using the brazing metal foil shown in FIG. 5C, according to the present invention. As is apparent from FIG. 6, an effect other than those described above can be obtained using the brazing metal foil shown in FIGS. 5A to 5C. That is, barrier layer 32 is not melted upon the heating of the brazing and maintains its mechanical strength. Therefore, even if the position of metal cover member 2 is caused to deviated slightly, barrier layer 32 functions as a coupling member to obtain a predetermined air-tight container.

In the method of manufacturing a vacuum interrupter according to the present invention, the arc-shield shown in FIG. 2 is directly bonded to the inner surface of ceramic tubular member 1 using the above-mentioned bonding method. Therefore, a bonding having a sufficiently good strength can be obtained between both the materials, and the removal or movement of the arc-shield can be prevented. As a result, the reliability of the valve can be improved because, e.g., fluctuations in the withstand voltage characteristic can be suppressed. In addition, since no independent metallizing step is required, the manufacturing steps can be simplified.

In the manufacturing of the vacuum valve, the above-mentioned effects can also be obtained by using the brazing metal foil shown in FIG. 5A.

In the vacuum interrupter manufacturing, it is preferable that the ceramic tubular member has a surface roughness ranging from 0.1 to 10 $\mu$m in order to sufficiently withstand the voltage of the vacuum valve.

The present invention will be described in more detail below by way of its Examples.

EXAMPLE 1

(Manufacturing an Air-tight Ceramic Container)

An air-tight ceramic container as shown in FIG. 1 was manufactured as follows.

First, $Al_2O_3$ ceramic tubular member 1 having an outer diameter of 60 mm, an inner diameter of 50 mm, and a height of 60 mm was prepared. A Ti powder and a Zr powder both having a grain size of 5 μm or less were mixed at a ratio of 9:1 and then kneaded with an ethanol solution of methyl cellulose, thereby preparing an active metal paste. Then, this paste was applied to both opening end faces of ceramic tubular member 1. At that time, a coating amount of the paste was adjusted so that the active metal was coated in an amount of 1 mg/cm².

Subsequently, a 50 μm thick Ag brazing filler metal (72% Ag-Cu) was placed on the above paste-applied surface of ceramic tubular member 1. Then, metal cover members 2 consisting of a kovar (Ni-Co-Fe alloy) were placed on the brazing filler metal as described above with reference to FIGS. 1A. The resultant multi-layered structure, similar to those shown in FIGS. 5A to 5C, was heated in a vacuum furnace ($2 \times 10^{-5}$ Torr) at 850° C. for five minutes to bond metal cover members 2 to the opening end faces of ceramic tubular member 1.

After the air-tight ceramic container obtained in the above manner was allowed to cool, it was then taken out from the furnace, and the bond portions were checked. As a result, brazing filler metal layer 8 which bonded metal cover member 2 with ceramic tubular member 1 was found to have a good bonding structure as shown in FIG. 1B, and cover member 2 was fixed tightly to ceramic tubular member 1. The air-tight property of the bonding portion of the air-tight ceramic container was evaluated by an He leakage test, and the He leakage amount was found to be $10^{-10}$ Torr.l/sec or less, i.e., no substantial leakage was found.

EXAMPLE 2

(Manufacturing an Air-tight Ceramic Container)

As shown in FIG. 4A, a donut-like Ag brazing foil (72% Ag-Cu) having projections which protrude to a height of 50 μm on its upper surface, an outer diameter of 50 mm, an inner diameter of 40 mm, and a thickness of 100 μm was prepared. In addition, $Al_2O_3$ ceramic tubular member 1 having an outer diameter of 50 mm, an inner diameter of 40 mm, and a height of 60 mm was prepared.

1 mg/cm² of a Ti powder was applied to both opening end faces of ceramic tubular member 1. The above Ag brazing metal foils were placed on Ti-applied surfaces. Following the same procedures as in Example 1, metal cover members 2 consisting of an Ni-Fe alloy were placed on the Ag brazing metal foil and heated in a vacuum furnace ($2 \times 10^{-5}$ Torr) at 880° C. for six minutes. As a result, metal cover members 2 were bonded to the opening end faces of ceramic tubular member 1.

The air-tight ceramic container obtained in the above manner was then removed from the furnace and examined, after it was allowed to cool. A resulting internal high vacuum was maintained, and the bonding state was good.

EXAMPLE 3

(Manufacture of Air-tight Ceramic Container)

As shown in FIG. 4B, a donut-like Ag brazing foil (72% Ag-Cu) having projections with a height of 100 μm and a through hole provided in each projection and having an outer diameter of 40 mm, an inner diameter of 30 mm, and a thickness of 100 μm was prepared. In addition, $Al_2O_3$ ceramic tubular member 1 having an outer diameter of 40 mm, an inner diameter of 30 mm, and a height of 40 mm was prepared.

1 mg/cm² of a Ti powder was applied on both opening end faces of ceramic tubular member 1. The above Ag brazing foil were placed on Ti-applied surfaces. Following the same procedures as in Example 1, metal cover members 2 consisting of an Ni-Fe alloy were placed on the brazing foil and heated in a vacuum furnace ($2 \times 10^{-5}$ Torr) at 850° C. for six minutes. As a result, metal cover members 2 were bonded to the opening end faces of ceramic tubular member 1.

The air-tight ceramic container obtained in the above manner was taken out from the furnace after cooling and then checked. As a result, internal high vacuum was maintained, and a bonding state was good.

EXAMPLE 4

In this Example 4 and next Example 5, an effect of barrier layer 32 in the brazing metal foil of FIG. 5A was checked.

As shown in FIG. 5A, 50 μm thick barrier layer 32 consisting of 13% Cr-Fe was interposed between 50 μm thick Ag brazing filler metal layer 31 consisting of 4% Ti-69% Ag-Cu and 50 μm thick Ag brazing filler metal layer 33 consisting of 72% Ag-Cu, thereby preparing a brazing metal foil. In addition, $Al_2O_3$ ceramic tubular member 1 having an outer diameter of 40 mm, an inner diameter of 30 mm, and a height of 60 mm was prepared.

The above brazing metal foil were disposed on opening end faces of ceramic tubular member 1. Then, Ni-plated metal cover members 2 consisting of an Ni-Fe alloy were placed on the brazing metal foil and heated in a vacuum furnace ($2 \times 10^{-5}$ Torr) at 850° C. for 10 minutes. As a result, metal cover members 2 were bonded to the opening end faces of ceramic tubular member 1. The air-tight ceramic container obtained in this manner was taken out from the furnace after cooling and checked. As a result, good bonding was confirmed throughout the entire bonding surface.

For comparison, a bonding test was performed following the same procedures as described above except that a 100 μm thick brazing filler metal foil consisting of only 1% Ti-71% Ag-Cu was used. As a result, incomplete bonding portions were partially found. It can be assumed that these incomplete bonding portions were produced because Ni diffused from an Ni-plated layer of metal cover member 2 formed an alloy together with Ti in the solder material.

EXAMPLE 5

As shown in FIG. 5C, 40 μm thick 4% Ti-69% Ag-Cu brazing filler metal layer 31, 20 μm thick Mo barrier layer 32, and 40 μm thick 72% Ag-Cu brazing filler metal layer 33 having a 20 μm deep recess in its lower surface for gas exhaustion were sequentially stacked to prepare a brazing filler metal foil. In addition, $Al_2O_3$ ceramic tubular member 1 having an outer diameter of 50 mm, an inner diameter of 40 mm, and a height of 60 mm and 42% Fe-Ni metal cover member 2 were prepared.

Then, ceramic tubular member 1, the brazing metal foil, and metal cover member 2 were disposed as shown in FIG. 6 and heated in a vacuum furnace ($2 \times 10^{-5}$ Torr) at 850° C. for 10 minutes. As a result, metal cover member 2 was bonded to an opening end face of ceramic tubular member 1. The air-tight ceramic container obtained in this manner was taken out from the furnace after cooling and then checked. As a result, although a position of metal cover member 2 is deviated slightly, continuity was maintained by barrier layer 32, and a good air-tight property was maintained.

EXAMPLES 6-8

(Manufacture of Vacuum Valve)

Figure 7:
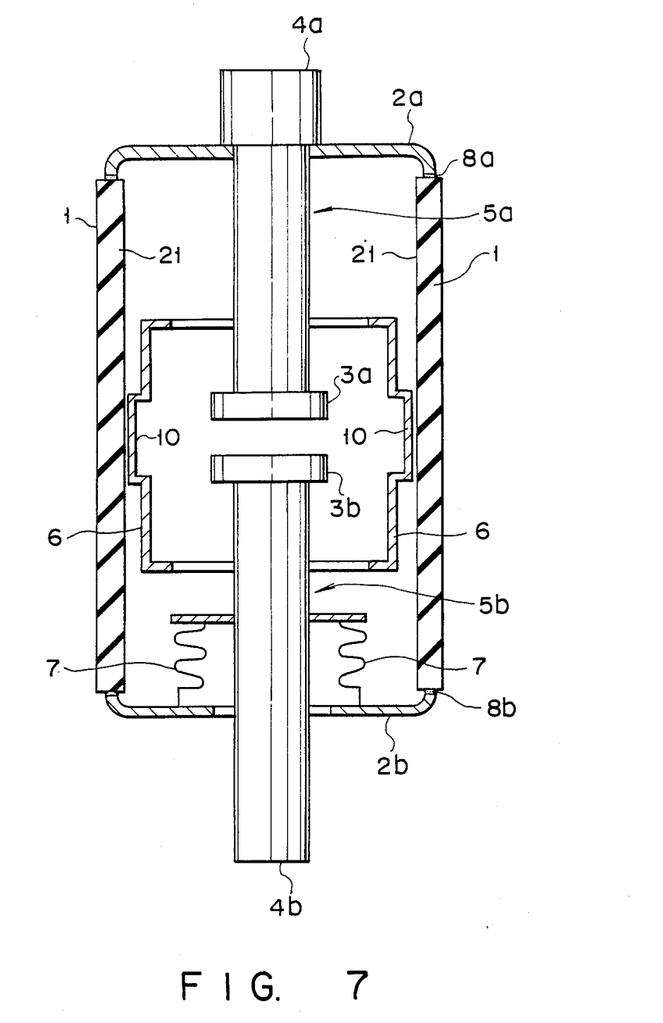
FIGS. 7 and 8 are sectional views of a vacuum interrupter obtained by an embodiment of the present invention.
Figure 8:
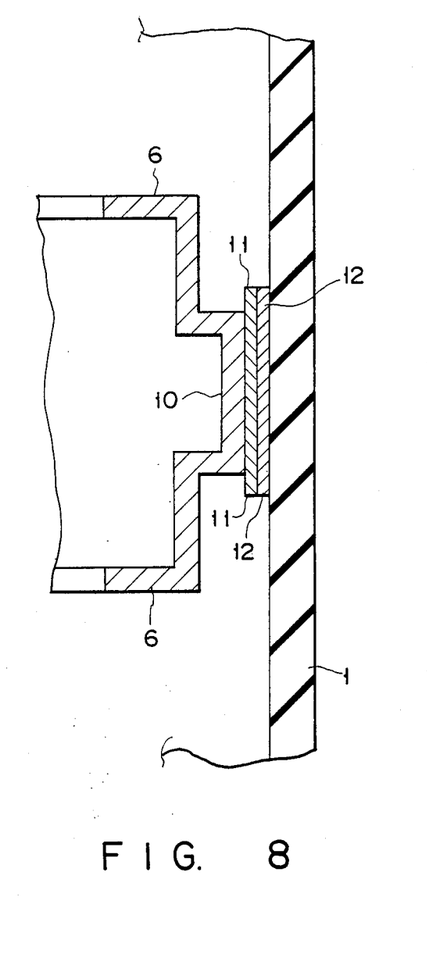

In Examples 6 to 8, a vacuum valve shown in FIGS. 7 and 8 was manufactured. In FIGS. 7 and 8, the same parts as in FIGS. 2 and 3 are denoted by the same reference numerals.

First, $Al_2O_3$ ceramic tubular member 1 having an outer diameter of 123 mm, an inner diameter of 110 mm, and a height of 170 mm was prepared, and its inner surface 21 was polished. A degree of polishing was adjusted to obtain surface roughness values of 0.1 $\mu$m (Example 6), 0.5 $\mu$m (Example 7), and 10 $\mu$m (Example 8), respectively.

Then, a Ti powder having an average grain size of 3.5 $\mu$m was prepared and uniformly applied on a necessary portion (portion to be bonded to arc-shield 6) on polished ceramic tubular member inner surface 21, thereby forming active metal coating layer 12. The Ti powder was applied in an amount of 1 mg/cm$^2$ by a brush through a metal mesh. However, the Ti powder may be adhered by sputtering, vacuum deposition, or ion plating after a portion other than the necessary portion was masked.

As shown in FIG. 8, 0.2 mm thick silver brazing filler was interposed between Ti-applied surface 21 and projection 10 formed on SUS arc-shield 6, thereby performing brazing. This brazing was performed at a vacuum pressure of $2 \times 10^{-5}$ Torr and a temperature of 850° C. for six minutes.

As a result, the arc-shield was completely connected without a loosening in any of Examples 6, 7, and 8.

An impulse withstand voltage test was performed for the vacuum valves obtained in Examples 6 to 8 by a voltage-elevating method. As a result, assuming that an impulse withstand voltage value of the conventional vacuum interrupter shown in FIG. 2 is 100%, a high value of 130% was obtained in any of Examples 6 to 8. This is because no projection 1' was formed on the inner surface of ceramic tubular member 1 and a perfect air-tight property was obtained.

EXAMPLE 9

(Manufacture of Vacuum Valve)

Figure 9:
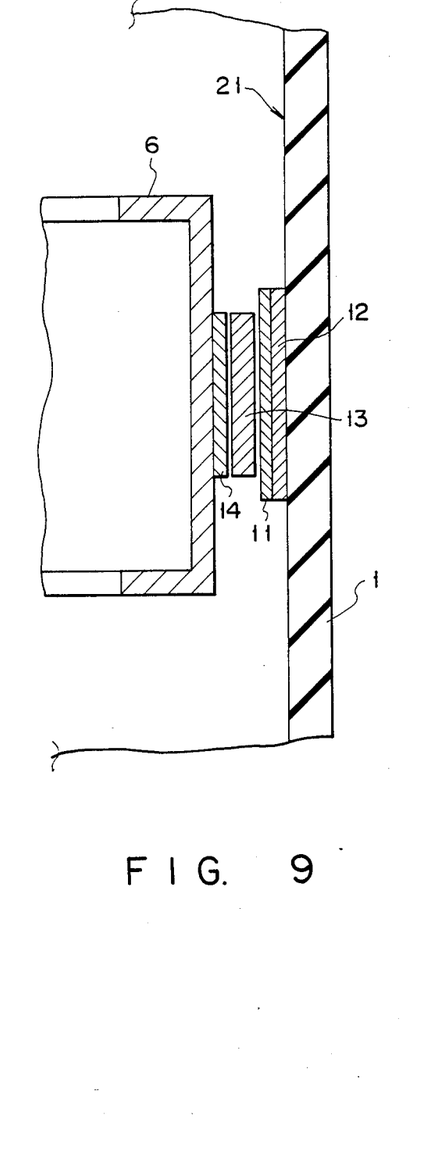
FIGS. 9 to 11 are sectional views of the main part of the vacuum interrupter obtained by other embodiments of the present invention, respectively.

In this Example, a bonding structure shown in FIG. 9 was formed between arc-shield 6 and ceramic tubular member 1. In this case, projection 10 shown in FIG. 6 was not provided to arc-shield 6. However, SUS spacer 13 (for example stainless steel or Cu) and silver brazing filler 14 were interposed between a bonding portion of SUS arc-shield 6 and inner surface 21 of ceramic tubular member 1.

Note that a surface roughness of polished inner surface 21 of the ceramic tubular member was 0.5 $\mu$m. In addition, following the same procedures as in Examples 6 to 8, 1 mg/cm$^2$ of a Ti powder having an average grain size of 3.5 $\mu$m was adhered as active metal powder on a portion to be bonded, thereby forming active metal layer 12.

Silver brazing filler 11 and 14 were melted and brazing is performed at a vacuum pressure of $2 \times 10^{-5}$ Torr and a temperature of 850° C. for six minutes.

An impact load of 1,500 kgf was repeatedly applied on the obtained vacuum interrupter 100 thousand times, but the arc-shield was not removed or got out of the place nor loosed.

When a repeated impulse withstand voltage test was performed, a value of 140% was obtained assuming that an impulse withstand voltage value of the conventional vacuum interrupter of FIG. 2 was 100%.

EXAMPLES 10 & 11

(Manufacture of Vacuum Valve)

Figure 10:
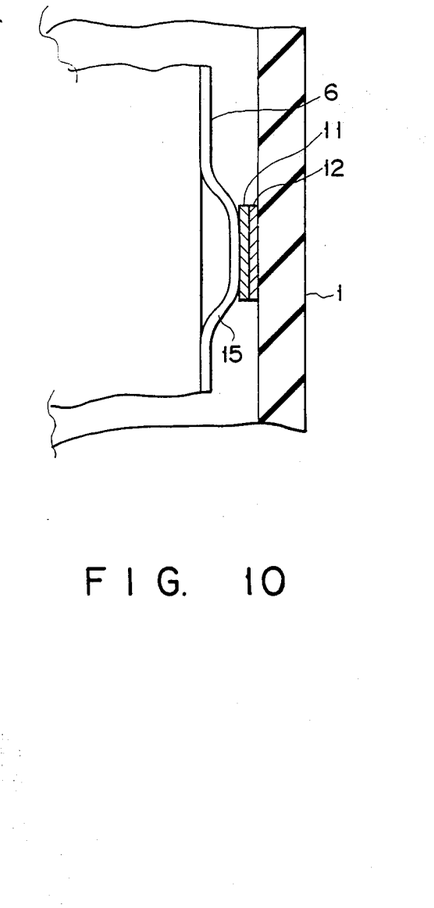
Figure 11:
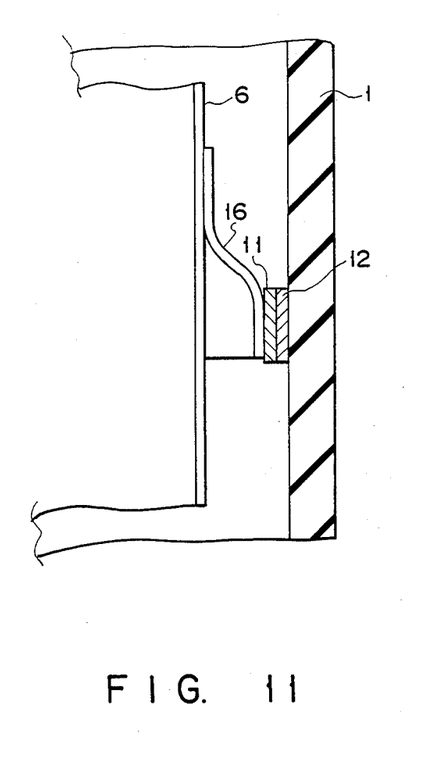

In these Examples, a stress relaxation mechanism was used to bond ceramic tubular member 1 with arc-shield 6. That is, in Example 10, stress relaxation member 15 was interposed between ceramic tubular member 1 and arc-shield 6 as shown in FIG. 10. In Example 11, projection 16 was formed on part of arc-shield 6 to obtain a stress relaxation effect as shown in FIG. 11.

Since a coefficient of thermal expansion of arc-shield 6 is larger than ceramic tubular member 1 by about 10 times, a thermal strain may be generated in the arc-shield upon brazing. Therefore, the structures of FIGS. 10 and 11 were formed in order to relax a thermal stress.

The arc-shield was bonded following the same procedures as in Examples 6 to 8 except that the above stress relaxation mechanism was adopted, thereby manufacturing a vacuum valve.

As a result of performing the impulse withstand voltage test as described above, the vacuum valves obtained in Examples 10 and 11 had withstand voltage values of 135% and 140%, respectively. The arc-shield did not cause any loosening in either vacuum valve.

EXAMPLES 12 & 13

(Manufacture of Vacuum Valve)

In any of Examples 6 to 11, the active metal powder having an average grain size of 3.5 $\mu$m was used. Therefore, the grain size of the active metal powder was changed and results were checked.

That is, vacuum valves were manufactured following the same procedures as in Example 9 except that active metal powders having average grain sizes of 1 $\mu$m (Example 12) and 10 $\mu$m (Example 13) were used.

As a result, in either of Example 12 (1 $\mu$m) and Example 13 (10 $\mu$m), good bonding was found as in Example 7 (3.5 $\mu$m).

EXAMPLES 14 & 15, Comparative Examples 1 & 2

(Manufacture of Vacuum interrupter)

In order to check an effect of a coating amount of the active metal powder, vacuum interrupters were manufactured following the same procedures as in Example 9 except that the coating amounts were 0.01 mg/cm$^2$ (Comparative Example 1), 0.1 mg/cm$^2$ (Example 14), 10 mg/cm$^2$ (Example 15), and 50 mg/cm$^2$ (Comparative Example 2).

As a result, in Comparative Example 1 (0.01 mg/cm$^2$), the arc-shield was not sufficiently bonded to the ceramic tubular member and hence was moved when an impact was applied thereto. In addition, fluctuations were found in withstand voltage when the impulse withstand voltage test was performed. In Comparative Example 2 (50 mg/cm$^2$), incomplete bonding portions were found, i.e., no good bonding was obtained. As a result, fluctuations were found in impulse withstand voltage.

To the contrary, in Examples 14 and 15 (0.1 mg/cm$^2$ and 10 mg/cm$^2$), the arc-shield was not moved, and no fluctuations were found in impulse withstand voltage.

EXAMPLE 16

In this Example, a vacuum interrupter was manufactured following the same procedures as in Example 9 except that a powder mixture of Ti:Zr=1:1 was used as an active metal powder. As a result, the arc-shield was not moved, and the impulse withstand voltage characteristic was as good as 130%.

As has been described above in detail, according to the present invention, an air-tight ceramic container having a sufficient bonding strength and a high air-tight property can be manufactured by brazing a peripheral endface of a metal cover member to an opening end face of a ceramic tubular member, without independent step of metallizing the opening end face in advance. In addition, when an arc-shield is fixed to an inner surface of the air-tight ceramic container to manufacture a vacuum interrupter, the arc-shield can be easily bonded with a sufficient strength, thereby manufacturing the vacuum interrupter having a stable withstand voltage characteristic.

What is claimed is:

1. A method of manufacturing an air-tight ceramic container, comprising the steps of: coating an active metal consisting of Li and/or Zr on an opening end face of a ceramic tubular member in tight contact therewith by means of an organic adhesive in an amount of 0.1 to 10 mg/cm$^2$, thereby forming an active metal layer which is not reacted with the ceramic member; placing a brazing filler metal on said active metal layer; placing a metal cover member for shielding an opening portion of said ceramic tubular member so that a peripheral portion end face of said metal cover is in contact with said brazing filler metal; melting said brazing filler metal by heating, thereby simultaneously reacting the active metal layer with the ceramic base to form a metal-ceramic bond and brazing said metal cover thereto.

2. A method according to claim 1, wherein a paste containing a powder of said active metal is applied to coat said active metal.

3. A method according to claim 1, wherein a powder of said active metal is sprayed to be adhered on the opening end face of said ceramic tubular member on which an adhesive material is applied in order to coat said active metal on said member.

4. A method according to claim 2, wherein the powder of said active metal has an average grain size which is not more than 10 μm.

5. A method according to claim 1, wherein an integral foil of brazing filler metal having an upper surface on which a projection is formed in a widthwise direction of the opening end face of said ceramic tubular member and a smooth lower surface is used as said brazing filler metal.

6. A method according to claim 5, wherein said foil of brazing filler metal in which a through hole is formed in the projections is used.

7. A method according to claim 1, wherein a foil of brazing filler metal has a multi-layer structure in which two brazing filler metal layers sandwich a barrier layer consisting of a metal having a higher melting point than that of the brazing filler metal which remains unmelted after brazing.

8. An air-tight ceramic container manufactured by a method defined in claim 1.

9. A method of manufacturing a vacuum interrupter which comprises an air-tight ceramic container defined in claim 1; a pair of contact rods extending from the outside of said ceramic container through to the inside and opposed to each other, at least one of said contact rods being moved in an axial direction so that said contact rods can be opened/closed; metal contact members arranged at the distal ends of said contact rods; a bellows for moving said contact rods in the axial direction while maintaining a vacuum state in said container; and a metal arc-shield, positioned to surround said contact members, for preventing the metal evaporated from said contact members from adhering to an inner surface of said tubular member, comprising he steps of: coating a powder of an active metal consisting of Li and/or Zr to an inner surface of the ceramic tubular member in tight contact therewith by means of an organic adhesive in an amount of 0.1 to 10 mg/cm$^2$, thereby forming an active metal layer which is not reacted with the ceramic member; placing a brazing filler metal on said active metal layer; placing said arc-shield to be in contact with the brazing filler metal; melting said brazing filler metal by heating thereby simultaneously reacting the active metal layer with the ceramic base to form a metal-ceramic bond and brazing said arc-shield to the inner surface of said tubular member.

10. A method according to claim 9, wherein a paste containing a powder of said active metal is applied in order to coat said active metal.

11. A method according to claim 9, wherein a powder of said active metal is sprayed to be adhered to the inner surface of said ceramic tubular member on which an adhesive is applied in order to coat said active metal.

12. A method according to claim 9, wherein a stress relaxation member is provided to said arc-shield, and said stress relaxation member is bonded by way of brazing directly to the inner surface of said ceramic tubular member.

13. A vacuum interrupter manufactured by a method defined in claim 9.

* * * * *

UNITED STATES PATENT AND TRADEMARK OFFICE
CERTIFICATE OF CORRECTION

PATENT NO. : 4,917,642

DATED : April 17, 1990

INVENTOR(S) : Masako NAKAHASHI et al

It is certified that error appears in the above-identified patent and that said Letters Patent is hereby corrected as shown below:

Claim 1, "Li" should read --Ti--.

Claim 9, "Li" should read --Ti--.

Signed and Sealed this

Third Day of September, 1991

*Attest:*

HARRY F. MANBECK, JR.

*Attesting Officer*  *Commissioner of Patents and Trademarks*